United States Patent
Kim et al.

(10) Patent No.: US 7,781,336 B2
(45) Date of Patent: Aug. 24, 2010

(54) SEMICONDUCTOR DEVICE INCLUDING RUTHENIUM ELECTRODE AND METHOD FOR FABRICATING THE SAME

(75) Inventors: Jin-Hyock Kim, Ichon-shi (KR);
Jae-Sung Roh, Ichon-shi (KR);
Seung-Jin Yeom, Ichon-shi (KR);
Kee-Jeung Lee, Ichon-shi (KR);
Han-Sang Song, Ichon-shi (JP);
Deok-Sin Kil, Ichon-shi (KR);
Young-Dae Kim, Ichon-shi (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 28 days.

(21) Appl. No.: 11/978,604

(22) Filed: Oct. 30, 2007

(65) Prior Publication Data
US 2008/0272490 A1 Nov. 6, 2008

(30) Foreign Application Priority Data
May 4, 2007 (KR) .................. 10-2007-0043697

(51) Int. Cl.
*H01L 21/00* (2006.01)
(52) U.S. Cl. .............. 438/653; 438/256; 438/386
(58) Field of Classification Search .......... 438/653, 438/256, 386
See application file for complete search history.

(56) References Cited

U.S. PATENT DOCUMENTS

| | | | |
|---|---|---|---|
| 5,879,980 A * | 3/1999 | Selcuk et al. | 438/238 |
| 6,743,678 B2 * | 6/2004 | Lee et al. | 438/257 |
| 6,890,841 B2 * | 5/2005 | Lee et al. | 438/487 |
| 6,893,915 B2 | 5/2005 | Park et al. | |
| 7,271,055 B2 * | 9/2007 | Lee et al. | 438/240 |
| 7,504,725 B2 * | 3/2009 | Kim et al. | 257/751 |
| 2004/0164328 A1 * | 8/2004 | Lee et al. | 257/213 |
| 2004/0241940 A1 * | 12/2004 | Lee et al. | 438/256 |
| 2005/0026452 A1 * | 2/2005 | Lee et al. | 438/745 |

(Continued)

FOREIGN PATENT DOCUMENTS

KR 10-2001-0001595 1/2001

(Continued)

OTHER PUBLICATIONS

Notice of Allowance issued from the Korean Intellectual Property Office on Dec. 4, 2008, in related Korean application No. 10-2007-0043697.

(Continued)

*Primary Examiner*—Laura M Menz
(74) *Attorney, Agent, or Firm*—IP & T Law Firm PLC (57) ABSTRACT

A semiconductor device includes a semiconductor substrate, an insulation pattern on the semiconductor substrate, and an etch stop layer on the insulating pattern, the insulation pattern and the etch stop layer defining a contact hole that exposes the substrate, a first plug filled in a portion of the contact hole, a diffusion barrier layer formed above the first plug and in a bottom portion and on sidewalls of a remaining portion of the contact hole, a second plug formed on the diffusion barrier layer and filled in the contact hole, and a storage node coupled to and formed on the second plug.

13 Claims, 10 Drawing Sheets

U.S. PATENT DOCUMENTS

| | | |
|---|---|---|
| 2006/0270177 A1 | 11/2006 | Park et al. |
| 2007/0042604 A1* | 2/2007 | Ahn et al. .................... 438/689 |
| 2007/0099375 A1 | 5/2007 | Kim et al. |
| 2007/0284647 A1* | 12/2007 | Seo et al. .................... 257/315 |
| 2008/0003741 A1* | 1/2008 | Park et al. .................... 438/238 |
| 2008/0157093 A1* | 7/2008 | Cho et al. ..................... 257/71 |
| 2008/0272490 A1* | 11/2008 | Kim et al. .................... 257/751 |
| 2009/0008743 A1* | 1/2009 | Lee et al. .................... 257/532 |

FOREIGN PATENT DOCUMENTS

| | | |
|---|---|---|
| KR | 10-2002-0091663 A | 12/2002 |
| KR | 10-2006-0126310 A | 12/2006 |

OTHER PUBLICATIONS

Abstract Partial English translation of the Notice of Preliminary Rejection issued from the Korean Intellectual Property Office on March 17, 2008, in a related Korean patent application No. 10-2007-0043697.

Notice of Preliminary Rejection issued from the Chinese State Intellectual Property Office on Nov. 27, 2009.

* cited by examiner

FIG. 6F

SEMICONDUCTOR DEVICE INCLUDING RUTHENIUM ELECTRODE AND METHOD FOR FABRICATING THE SAME

CROSS-REFERENCE TO RELATED APPLICATIONS

The present invention claims the benefit of priority to Korean patent application number 10-2007-0043697, filed on May 4, 2007, the entire contents of which are incorporated herein by reference.

BACKGROUND

The present invention relates to a method for fabricating a semiconductor device, and more particularly, to a method for fabricating a semiconductor device including a ruthenium electrode.

As memory devices become more highly integrated due to the development of semiconductor process technology, a unit cell surface area of the memory devices is decreased and a driving voltage is lowered. In a capacitor including a silicon-insulator-silicon (SIS) structure, it is difficult to secure a capacitance of greater than approximately 25 fF due to the existence of an interfacial oxide layer. Thus, a capacitor including a metal-insulator-metal (MIM) cylinder structure using a metal electrode has been developed. Meanwhile, high-k materials, such as titanium oxide ($TiO_2$), tantalum oxide ($Ta_2O_5$), and strontium titanate ($SrTiO_3$), are expected to be used for a dielectric layer in a semiconductor memory device having the design rule of approximately 45 nm or less. It has been reported that a phase or a preferred orientation having a higher dielectric constant than that of a typical titanium nitride (TiN) electrode may be obtained when ruthenium (Ru) is used as an electrode material.

Figure 1:
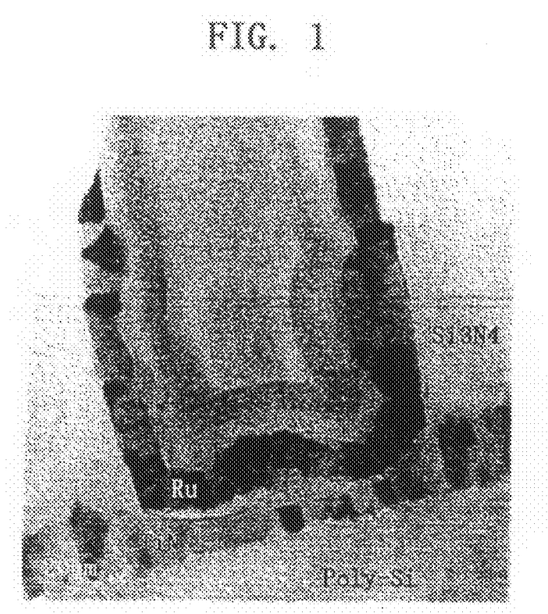
FIG. 1 illustrates a micrographic view showing lifting of a typical ruthenium electrode.

However, oxygen ($O_2$) is typically used as a reaction gas when a ruthenium electrode is formed using a chemical vapor deposition (CVD) method or an atomic layer deposition (ALD) method. In such a case, a contact resistance (Rc) may increase due to the oxidation of a TiN diffusion barrier layer formed below the ruthenium electrode in an initial stage of deposition. Also, a regional lifting may occur after the deposition due to a deteriorated adhesion with an etch stop layer, including silicon nitride ($Si_3N_4$), which supports a bottom portion of the ruthenium electrode as shown in FIG. 1. Consequently, a bottom oxide layer may be wet etched during a full dip-out process while forming the capacitor having a cylinder or stack structure. Thus, a leaning of a bottom electrode may occur.

Figure 2:
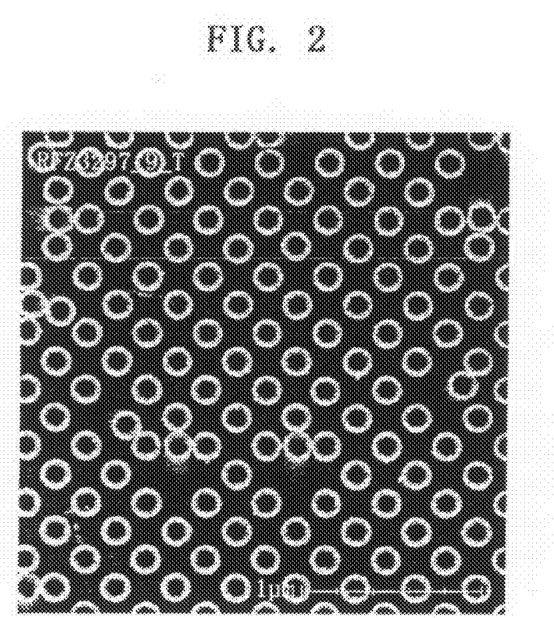
FIG. 2 illustrates a micrographic view showing leaning of typical storage nodes.

FIG. 1 illustrates a micrographic view showing a lifting occurred in a typical ruthenium electrode. The lifting is occurred on an interface between the ruthenium electrode and a titanium nitride (TiN) plug, or between the ruthenium electrode and the silicon nitride ($Si_3N_4$) layer. FIG. 2 illustrates a micrographic view showing leaning of storage nodes.

SUMMARY

Embodiments consistent with the present invention are directed to a semiconductor device and a method for fabricating the same, which can reduce oxidation of a storage node contact plug and obtain a sufficient level of adhesion between the storage node contact plug and an etch stop layer to prevent leaning of storage nodes caused by lifting of the storage node contact plug.

In accordance with an aspect consistent with the present invention, there is provided a semiconductor device, including: a semiconductor substrate; an insulation pattern on the semiconductor substrate, and an etch stop layer on the insulation pattern, the insulation pattern and the etch stop layer defining a contact hole that exposes the semiconductor substrate; a first plug filled in a lower portion of the contact hole; a diffusion barrier layer formed above the first plug and in a bottom portion and on sidewalls of a remaining portion of the contact hole; a second plug formed on the diffusion barrier layer and filled in the contact hole; and a storage node coupled to and formed on the second plug.

In accordance with another aspect consistent with the present invention, there is provided a method for fabricating a semiconductor device, including: providing a semiconductor substrate; forming an insulation structure on the semiconductor substrate, the insulation structure including a contact hole; forming a first plug in a portion of the contact hole; forming a diffusion barrier layer in a bottom portion and on sidewalls of a remaining portion of the contact hole; forming a second plug on the diffusion barrier layer and filled in the contact hole; and forming a storage node on the second plug.

DETAILED DESCRIPTION

Embodiments consistent with the present invention relate to a semiconductor device including a ruthenium (Ru) electrode and a method for fabricating the same. In one embodiment, a diffusion barrier layer including a titanium nitride (TiN) layer is formed on a surface that is in contact with a nitride-based layer. The diffusion barrier layer may function as an etch stop layer between a storage node and a storage node contact plug, i.e., a first plug including polysilicon. Also, a second plug including a Ru layer formed by performing a physical vapor deposition (PVD) method is formed over the diffusion barrier layer. Thus, adhesiveness between the diffusion barrier layer and the second plug is increased and oxidation of the diffusion barrier layer is reduced.

Whenever possible, the same or like reference numerals will be used to represent same or like elements in the drawings.

Figure 3:
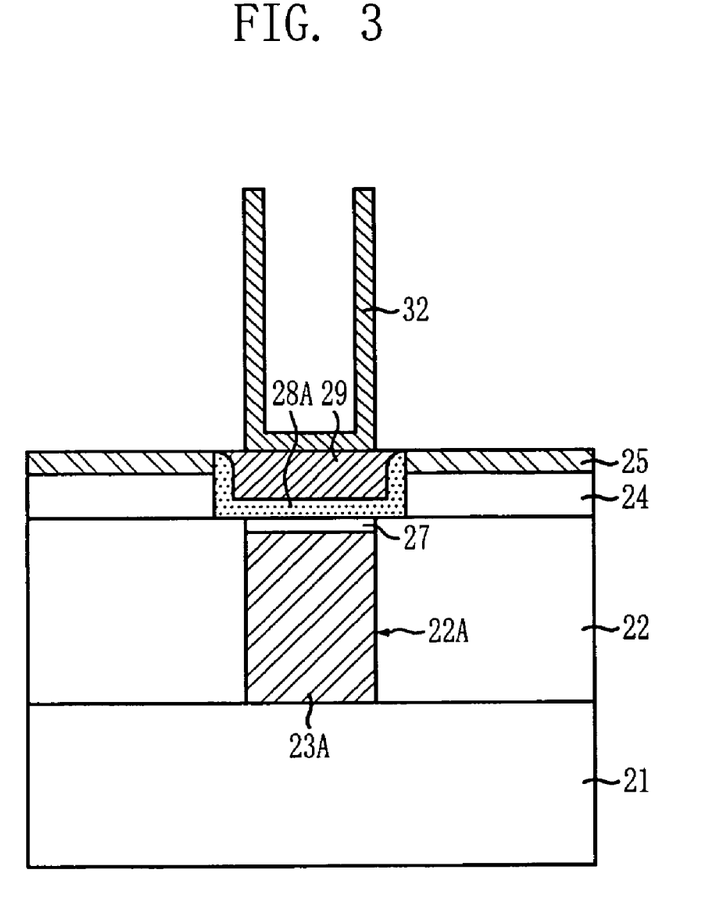
FIG. 3 illustrates a cross-sectional view of a semiconductor device consistent with the present invention.

FIG. 3 illustrates a cross-sectional view of a semiconductor device consistent with the present invention. Semiconductor device includes an insulation pattern 22 having a first contact hole 22A formed over a semiconductor substrate 21, a first plug 23A filled in first contact hole 22A, a stack structure including an etched buffer oxide layer 24 formed on insulation pattern 22 and a patterned etch stop layer 25 formed on etched buffer oxide layer 24, the stack structure having a second contact hole exposing first plug 23A, a diffusion barrier layer 28A formed on a bottom surface and sidewalls of the second contact hole, a second plug 29 filled in the second contact hole over diffusion barrier layer 28A, and a storage node 32 of a capacitor formed on second plug 29.

First plug 23A may include a polysilicon layer. Diffusion barrier layer 28A may include a TiN layer. Second plug 29 may include a Ru layer formed by performing, for example, a PVD method. An ohmic contact layer 27 may be formed over a surface of first plug 23A and below diffusion barrier layer 28A. Ohmic contact layer 27 may include a titanium silicide layer.

Insulation pattern 22 and etched buffer oxide layer 24 may each include an oxide-based material. Patterned etch stop layer 25 may include a nitride-based material. Storage node 32 may include a Ru layer or a ruthenium oxide layer. If storage node 32 includes the Ru layer, storage node 32 and second plug 29 may include substantially the same material.

Accordingly, a storage node contact plug structure that includes first plug 23A, diffusion barrier layer 28A, and second plug 29 is formed in contact with storage node 32, wherein diffusion barrier layer 28A is disposed between first plug 23A and second plug 29. Furthermore, ohmic contact layer 27 is formed between first plug 23A and diffusion barrier layer 28A to decrease the contact resistance.

In the storage node contact plug structure, diffusion barrier layer 28A is in contact with etched buffer oxide layer 24 and patterned etch stop layer 25. However, second plug 29 is not in contact with etched buffer oxide layer 24 and patterned etch stop layer 25 due to the presence of diffusion barrier layer 28A. Accordingly, a sufficient level of adhesiveness may be obtained because diffusion barrier layer 28A prevents second plug 29 and patterned etch stop layer 25 from contacting each other. Also, oxidation of diffusion barrier layer 28A does not occur, because second plug 29 includes the Ru layer formed by performing a PVD method, which does not use any oxygen gas.

FIGS. 4A to 4G illustrate cross-sectional views of a method for fabricating a semiconductor device consistent with the present invention.

Figure 4A:
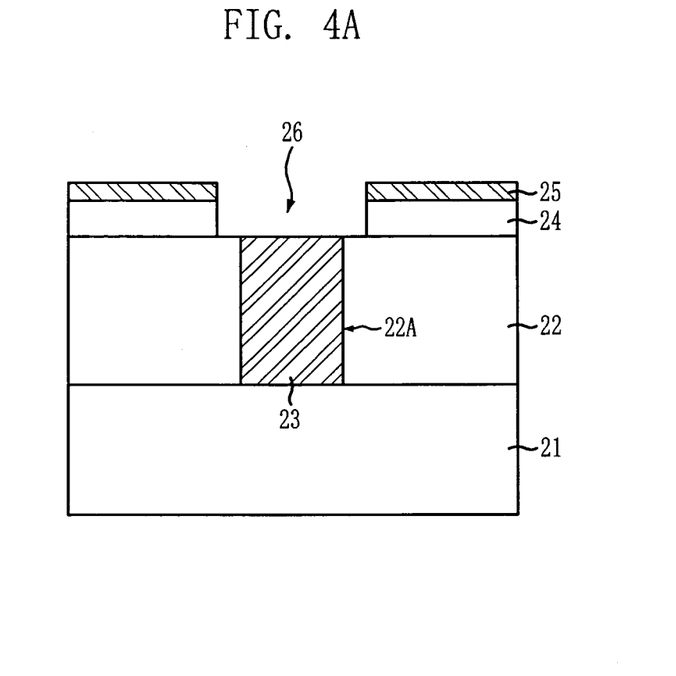
FIGS. 4A to 4G illustrate cross-sectional views of a method for fabricating a semiconductor device according to the first embodiment.

Referring to FIG. 4A, an insulation layer is formed on a semiconductor substrate 21. The insulation layer is etched to form an insulation pattern 22 having a first contact hole 22A to expose a surface of semiconductor substrate 21. A first plug 23 is filled in first contact hole 22A.

It is to be understood that semiconductor substrate 21 may have already been processed in advance to include features required in a dynamic random access memory (DRAM), such as isolation structures, gates, and/or bit lines. Semiconductor substrate 21 may include a silicon substrate, an impurity implantation layer, and a landing plug contact.

First plug 23 may include a polysilicon plug. The polysilicon plug may be formed by forming a polysilicon layer and performing an etch-back process. First plug 23 may function as a storage node contact (SNC) plug.

An etched buffer oxide layer 24 is formed on insulating pattern 22, and a patterned etch stop layer 25 is formed on etched buffer oxide layer 24. Etched buffer oxide layer 24 and patterned etch stop layer 25 include a second contact hole 26 to expose first plug 23. More specifically, a buffer layer may be formed over insulation pattern 22, and an etch stop layer may be formed over the buffer layer. The buffer layer may include an oxide-based layer. Thus, the buffer layer may hereinafter be referred to as a buffer oxide layer. The buffer oxide layer may include undoped silicate glass (USG), phosphosilicate glass (PSG), borophosphosilicate glass (BPSG), a hemispherical grain (HSG), plasma enhanced tetraethyl orthosilicate (PETEOS), or tantalum oxide ($Ta_2O_5$). The buffer oxide layer may be formed to have a thickness ranging from approximately 500 Å to approximately 3,000 Å. The etch stop layer may include a nitride-based layer. For instance, the etch stop layer may include a silicon nitride ($Si_3N_4$) layer.

The etch stop layer and the buffer oxide layer are etched to form second contact hole 26 exposing a surface of first plug 23. Etched buffer oxide layer 24 and patterned etch stop layer 25 are thus formed from the buffer oxide layer and the etch stop layer, respectively. At this time, an exposed surface area of second contact hole 26 is larger than an exposed surface area of first contact hole 22A. The exposed surface area of second contact hole 26 being larger than that of first contact hole 22A secures an overlap margin between a subsequent diffusion barrier layer and a subsequent second plug to be formed in second contact hole 26 and a subsequent storage node to be formed over the second plug.

Figure 4B:
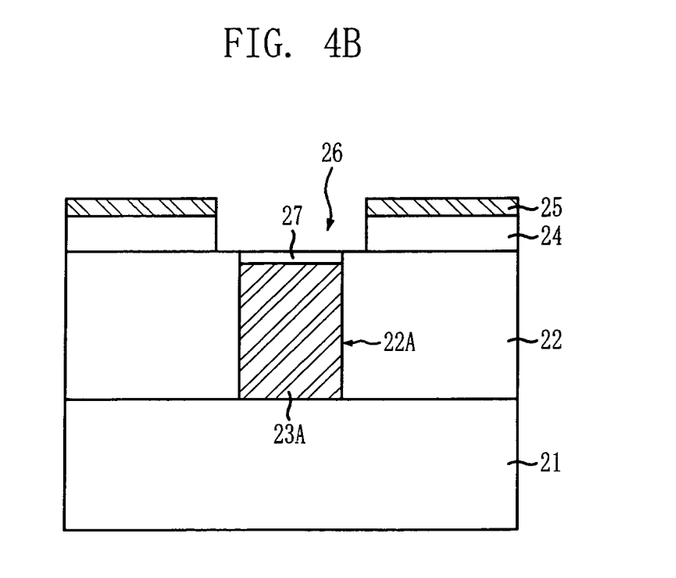

Referring to FIG. 4B, an ohmic contact layer 27 is formed over first plug 23. Reference numeral 23A refers to a remaining first plug 23A. The ohmic contact layer 27 may include a metal silicide layer. For instance, ohmic contact layer 27 may include a titanium silicide layer. The titanium silicide layer may be formed by performing a chemical vapor deposition (CVD) process or an atomic layer deposition (ALD) process to form a titanium (Ti) layer having a thickness of approximately 50 Å. Then, a rapid thermal anneal (RTA) process or a furnace thermal treatment process is performed, and a cleaning process is performed to remove non-reacted portions of the titanium layer. The titanium layer and the polysilicon layer, which constitute first plug 23, react with each other to form the titanium silicide layer.

Figure 4C:
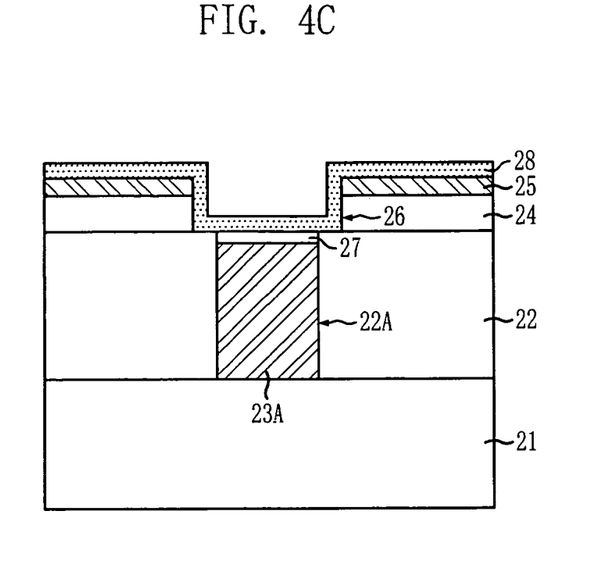

Referring to FIG. 4C, a conductive layer 28 having a desired level of step coverage property is formed on patterned etch stop layer 25, and on side walls and a bottom surface of second contact hole 26. For instance, conductive layer 28 may be a TiN layer. Conductive layer 28 may function as a diffusion barrier layer and a storage node contact plug. Further, conductive layer 28 may be formed using a CVD process or a sequential flow deposition (SFD) process to have a thickness ranging from approximately 50 Å to approximately 300 Å. Because the CVD method or the SFD method may secure the desired level of step coverage property, conductive layer 28 may be formed to have a uniform thickness.

Figure 4D:
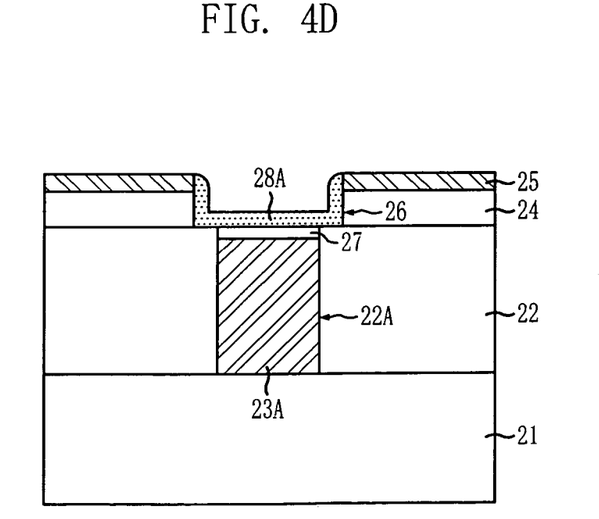

Referring to FIG. 4D, a chemical mechanical polish (CMP) process or an etch-back process is performed to etch portions of conductive layer 28 to expose surfaces of patterned etch stop layer 25. Thus, a diffusion barrier layer 28A is filled in second contact hole 26.

At this time, an etch-back process, such as a plasma etch process, is performed to form diffusion barrier layer 28A on the bottom surface and the sidewalls of second contact hole 26. The etch-back process may be performed in a chemical etch rather than in a physical etch. Thus, there is a reduced etching rate at a lower portion of second contact hole 26. Therefore, diffusion barrier layer 28A remains on the bottom surface of second contact hole 26.

For instance, a gas including argon (Ar) and chlorine ($Cl_2$) may be used in the etch-back process, such that physical and chemical etchings occur outside second contact hole 26 for conductive layer 28. A bias power may be controlled to be in a range from approximately 30 W to approximately 300 W to minimize physical etch at the bottom portion of second contact hole 26. Also, a content of the $Cl_2$ in the gas including Ar and $Cl_2$ may be controlled to be in a range from approximately 1% to approximately 50% in order to adequately control a level of the chemical etch by the $Cl_2$. A pressure in an etch chamber is controlled to be in a range from approximately 1 mTorr to approximately 50 mTorr, such that appropriate amounts of physical etch and chemical etch may occur.

When a plasma etch-back process is performed under the aforementioned conditions, portions of conductive layer 28 formed outside second contact hole 26 are etched at a high rate. In contrast, a very small portion of conductive layer 28 formed on the sidewalls of second contact hole 26 is etched, because the condition that causes slow chemical etch of conductive layer 28 formed on the sidewalls of second contact hole 26 is used, i.e., by controlling the content of the $Cl_2$ to be in a range from approximately 1% to approximately 50% in the gas including Ar and $Cl_2$. Furthermore, a very small portion of conductive layer 28 formed on the bottom portion of second contact hole 26 is etched. This result is achieved, because reaction by-products are generated by reaction between conductive layer 28 in second contact hole 26 and radicals filling second contact hole 26, thereby causing an increased pressure in second contact hole 26, and a bias power is controlled to be in a range from approximately 30 W to approximately 300 W. Thus, flows of positive ions impinging on the bottom portion of second contact hole 26 and radicals diffusing into second contact hole 26 are decreased.

Consequently, the portions of conductive layer 28 formed outside second contact hole 26 are etched at a high rate by physical chemical etch, and the portion of conductive layer 28 formed in the bottom portion of second contact hole 26 is etched at a slower rate than the portions outside second contact hole 26. Thus, diffusion barrier layer 28A is formed in a desired etched shape, even if a barrier-less plasma blanket etch process is performed in a vertical direction instead of a sloped direction.

During the aforementioned etch-back process on conductive layer 28, etch rates at the sidewalls and the bottom portion of second contact hole 26 are controlled to be in a range from approximately 1% to approximately 70% when compared with an etch rate outside of second contact hole 26. Also, the etch rate at the sidewalls of second contact hole 26 and the etch rate at the bottom portion of second contact hole 26 are controlled to be substantially the same.

Accordingly, a condition including a pressure of 10 mTorr, a source power of 300 W(S), a bias power of 100 W(B), a gas with 10 $Cl_2$/190 Ar, a temperature of 40° C., an end of point (EOP) of 16"±1", and an over etch (OE) of 10" is used.

For example, when the etch-back process is performed over conductive layer 28 having a thickness of approximately 300 Å under the aforementioned condition, the etch rate outside second contact hole 26 is approximately 1,120 Å/min, and the etch rates at the sidewalls and the bottom portion of second contact hole 26 are approximately 10 Å/min, which is lower than the etch rate outside second contact hole 26. The etch rate of conductive layer 28 outside second contact hole 26 may range from approximately 500 Å/min to approximately 2,000 Å/min depending on specific conditions. The etch rate of conductive layer 28 in second contact hole 26 may range from approximately 5 Å/min to approximately 140 Å/min, which is approximately 7% of 2,000 Å/min.

The etch rate changes according to the content of the gas of $Cl_2$/Ar. For instance, the etch rate is approximately 500 Å/min or greater when the content of the gas of $Cl_2$/Ar is very low, and the etch rate is approximately 3,000 Å/min when the content of the gas of $Cl_2$/Ar is very high. That is, controlling the content of the gas of $Cl_2$/Ar may change the etch rate to be in a range from approximately 500 Å/min to approximately 3,000 Å/min. However, the condition is controlled to reduce the etch rate, such that a profile or over etch is controlled. A throughput may not cause a significant limitation, because the thickness of conductive layer 28 is small.

For instance, a plasma etch-back process may be performed using a pressure ranging from approximately 5 mTorr to approximately 20 mTorr, a source power ranging from approximately 300 W to approximately 800 W, a bias power ranging from approximately 30 W to approximately 300 W, a gas including $Cl_2$ and Ar, wherein a ratio of $Cl_2$ to Ar is approximately 1% to approximately 50%, and a temperature of an electrode in a chamber ranging from approximately 10° C. to approximately 40° C.

In the aforementioned embodiment, the etch gas for performing chemical etch during the plasma etch-back process on conductive layer 28 may include other single or combined chlorine (Cl)-based gas, e.g., hydrogen chloride (HCl) or carbon tetrachloride ($CCl_4$), besides $Cl_2$. Ar, xenon (Xe), helium (He), or a combination thereof may be added for plasma stabilization, flow rate control, and etch gas dilution other than Ar-based and Cl-based gas. Also, oxygen ($O_2$), nitrogen ($N_2$), or a combination thereof may be added to provide passivation or to function as a reaction inhibitor, thereby reducing damage of diffusion barrier layer 28A by the predominant chemical etch.

Figure 4E:
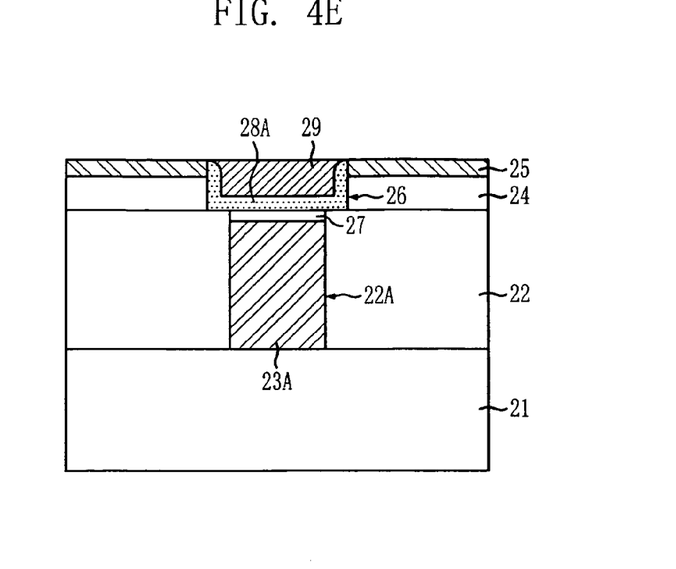

Referring to FIG. 4E, a conductive layer, e.g., a Ru layer, is formed using a PVD method to fill second contact hole 26 over diffusion barrier layer 28A. A CMP process or an etch-back process is performed to expose surfaces of patterned etch stop layer 25. Thus, a second plug 29 is formed and remained in second contact hole 26.

The Ru layer may be formed using the PVD process without oxygen gas. Furthermore, second contact hole 26 may be sufficiently filled by the Ru layer using the PVD method, because an aspect ratio of second contact hole 26 is small. Meanwhile, it may be inevitable to use oxygen gas as a reaction gas when a Ru layer is formed using a CVD method or an ALD method. Thus, a material below the Ru layer may be oxidized during the formation of the Ru layer. Accordingly, adhesiveness between a storage node contact plug and a storage node deteriorates, thereby causing lifting. In certain embodiments, the material below the Ru layer is not oxidized because the Ru layer for forming second plug 29 is formed using the PVD method, which does not require any oxygen gas.

According to the aforementioned process, the storage node contact plug including a structure comprising remaining first plug 23A, diffusion barrier layer 28A, and second plug 29 is formed in contact with a subsequent storage node, wherein diffusion barrier layer 28A is disposed between remaining first plug 23A and second plug 29. Furthermore, ohmic contact layer 27 including titanium silicide is formed between remaining first plug 23A and diffusion barrier layer 28A to decrease contact resistance.

In the aforementioned structure of the storage node contact plug, diffusion barrier layer 28A is in contact with etched buffer oxide layer 24 and patterned etch stop layer 25. However, second plug 29 is not in contact with etched buffer oxide layer 24 and patterned etch stop layer 25 due to the presence of diffusion barrier layer 28A. A sufficient level of adhesion may be achieved because diffusion barrier layer 28A prevents second plug 29 and patterned etch stop layer 25 from contacting each other. Also, oxidation of diffusion barrier layer 28A may not occur during the formation of the Ru layer, because the Ru layer used as second plug 29 is formed by the PVD method without any oxygen gas.

Figure 4F:
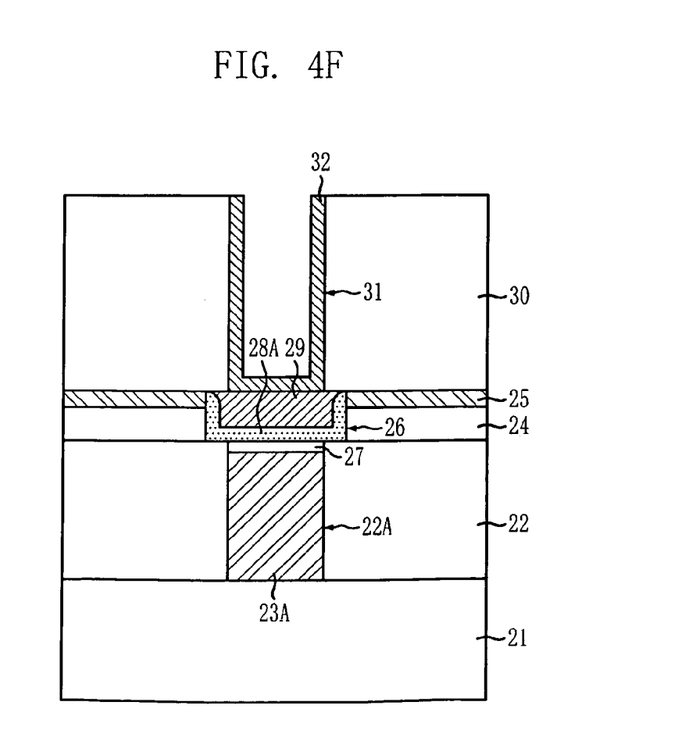

Referring to FIG. 4F, a sacrificial layer is formed over the resultant structure. The sacrificial layer is etched to form a patterned sacrificial layer 30 including a trench 31 to expose second plug 29. A storage node will be formed in trench 31. Patterned sacrificial layer 30 may include an oxide-based layer. For instance, patterned sacrificial layer 30 may include PSG, PETEOS, USG, high density plasma (HDP), and/or a combination thereof.

A Ru thin layer or a ruthenium oxide ($RuO_2$) thin layer may be formed on a bottom surface and on sidewalls of trench 31 as a storage node material of a storage node 32. An isolation process for isolating storage node 32 is performed using an etch-back process or a CMP process. The Ru thin layer or the $RuO_2$ thin layer may be formed using a CVD method, an ALD method, a cyclic CVD method, or a pseudo ALD method.

Storage node 32 may be formed to have a thickness ranging from approximately 100 Å to approximately 300 Å. Storage node 32 may also be formed in a manner that a bottom line width of storage node 32 is smaller than a line width of second plug 29.

Figure 4G:
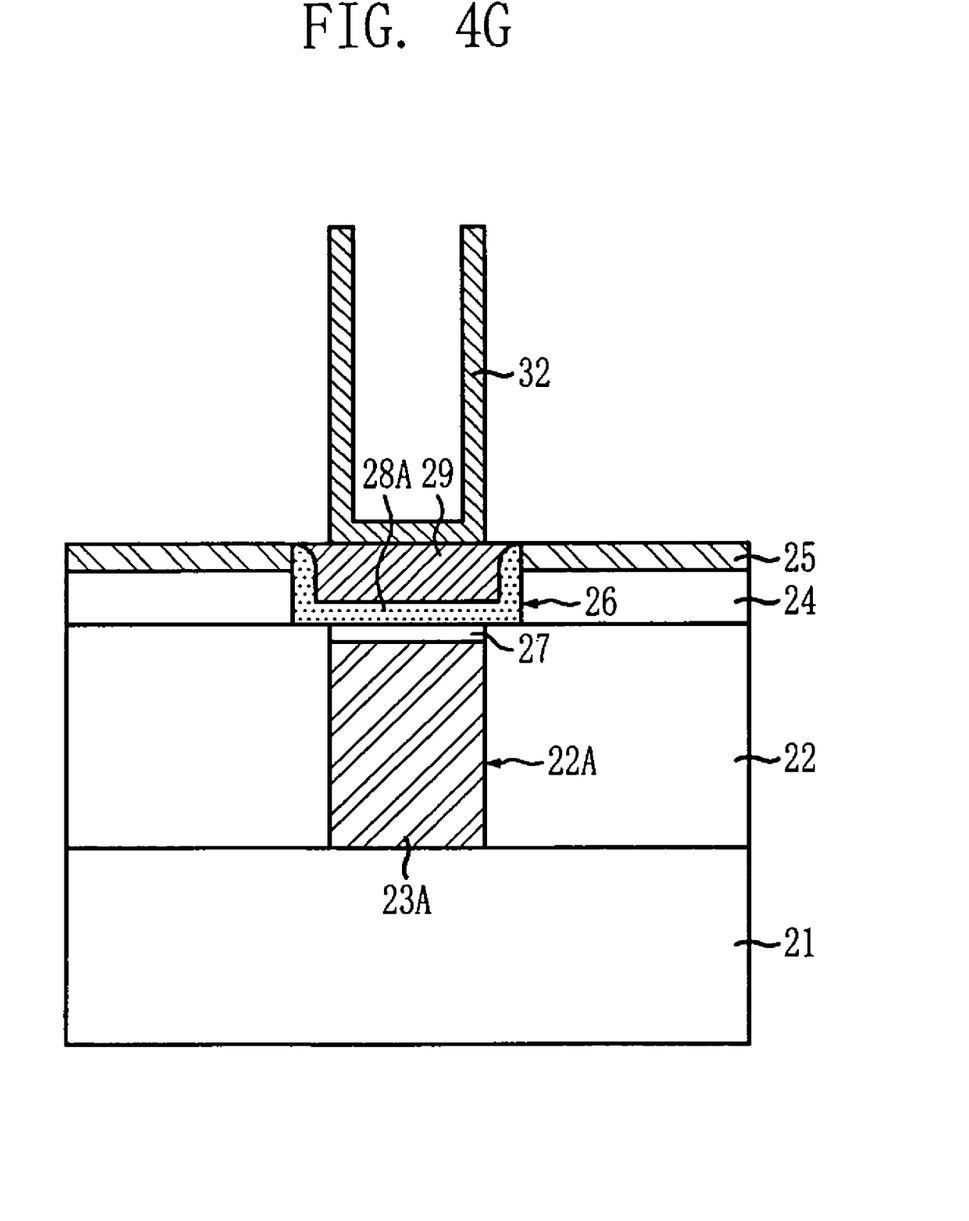

Referring to FIG. 4G, a full dip-out process is performed to substantially remove patterned sacrificial layer 30, such that storage node 32 having a cylinder structure is formed. At this time, the full dip-out process is performed using a chemical including hydrogen fluoride (HF), because patterned sacrificial layer 30 includes an oxide-based material. Etched buffer oxide layer 24 and insulation pattern 22 are not etched in the full dip-out process, because patterned etch stop layer 25 includes a nitride-based material.

Figure 5:
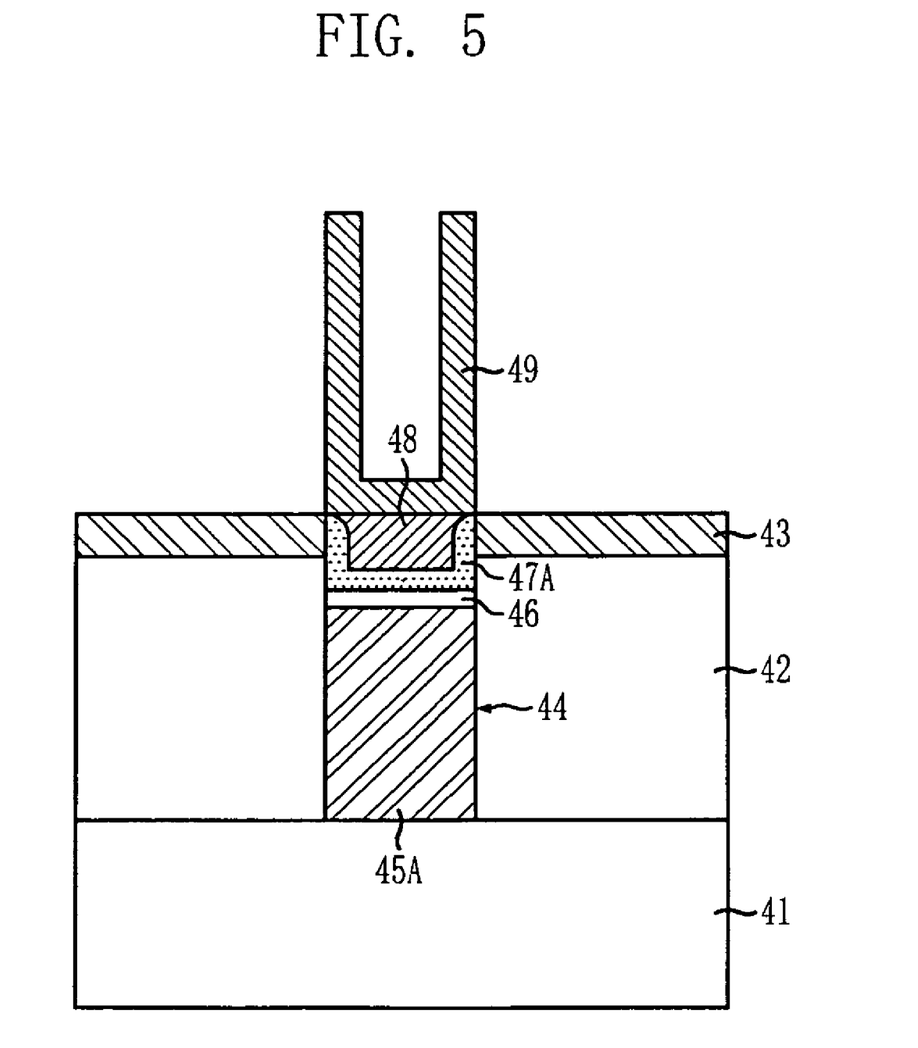
FIG. 5 illustrates a cross-sectional view of a structure of a semiconductor device consistent with the present invention.

FIG. 5 illustrates a cross-sectional view of a semiconductor device consistent with the present invention. The semiconductor device includes an insulation pattern 42 formed on a semiconductor substrate 41, and a patterned etch stop layer 43 formed on insulation pattern 42, insulation pattern 42 and patterned etch stop layer 43 defining a storage node contact hole 44. The semiconductor device further includes a remaining first plug 45A filled in a portion of storage node contact hole 44 providing a recess profile on remaining first plug 45A, a diffusion barrier layer 47A formed in a bottom portion and on sidewalls of the recess profile above remaining first plug 45A, a second plug 48 filled in the recess profile over diffusion barrier layer 47A, and a storage node 49 of a capacitor coupled to second plug 48.

Remaining first plug 45A may include a plug comprising a polysilicon layer. Diffusion barrier layer 47A may include a TiN layer. Second plug 48 may include a Ru layer. For instance, second plug 48 may include a Ru layer formed by performing a PVD method. Remaining first plug 45A may fill a portion of storage node contact hole 44 to provide the recess profile. An ohmic contact layer 46 may be formed between diffusion barrier layer 47A and remaining first plug 45A.

Insulation pattern 42 may include an oxide-based material. Patterned etch stop layer 43 may include a nitride-based material. Storage node 49 may include a Ru layer or a ruthenium oxide layer. Storage node 49 and second plug 48 may include substantially the same material if storage node 49 includes a Ru layer.

Accordingly, a structure including remaining first plug 45A (i.e., the storage node contact plug), diffusion barrier layer 47A, and second plug 48 is formed in contact with storage node 49, wherein diffusion barrier layer 47A is disposed between remaining first plug 45A and second plug 48. Furthermore, ohmic contact layer 46 may be formed between remaining first plug 45A and diffusion barrier layer 47A, thereby providing an ohmic contact.

In the structure of the storage node contact plug, diffusion barrier layer 47A is in contact with patterned etch stop layer 43. However, second plug 48 is not in contact with patterned etch stop layer 43 due to the presence of diffusion barrier layer 47A. Accordingly, a sufficient level of adhesion may be obtained because diffusion barrier layer 47A substantially prevents second plug 48 and patterned etch stop layer 43 from contacting each other. Also, oxidation of the TiN layer used as diffusion barrier layer 47A does not occur, because second plug 48 includes the Ru layer formed by performing a PVD method without any oxygen gas.

FIGS. 6A to 6F illustrate cross-sectional views of a method for fabricating a semiconductor device according to the second embodiment consistent with the present invention.

Figure 6A:
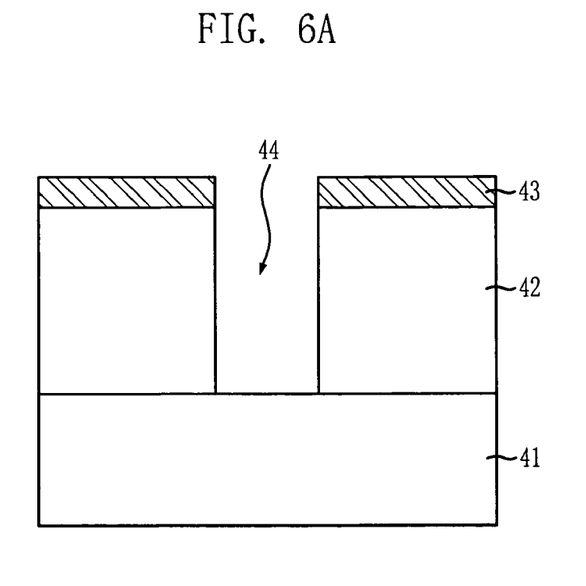
FIGS. 6A to 6F illustrate cross-sectional views of a method for fabricating a semiconductor device consistent with the present invention.

Referring to FIG. 6A, an insulation pattern 42 is formed on semiconductor substrate 41, and a patterned etch stop layer 43 is formed on insulation pattern 42. Insulation 10 pattern 42 and patterned etch stop layer 43 may define a storage node contact hole 44. More specifically, an insulation layer is formed on semiconductor substrate 41, and an etch stop layer is formed on the insulation layer. The insulation layer and the etch stop layer are etched to form storage node contact hole 44 exposing a surface of semiconductor substrate 41. Thus, insulation pattern 42 and patterned etch stop layer 43 are formed from the insulation layer and the etch stop layer, respectively. It is to be understood that semiconductor substrate 41 may have already been processed in advance to include features required in a typical DRAM, such as an isolation structure, gates, and bit lines. Semiconductor substrate 41 may include a silicon substrate, an impurity junction layer, or a landing plug contact. Insulation pattern 42 may be a multiple-layer structure including an oxide-based layer. Patterned etch stop layer 43 may include a nitride-based material. For instance, patterned etch stop layer 43 may include a silicon nitride ($Si_3N_4$) layer.

Figure 6B:
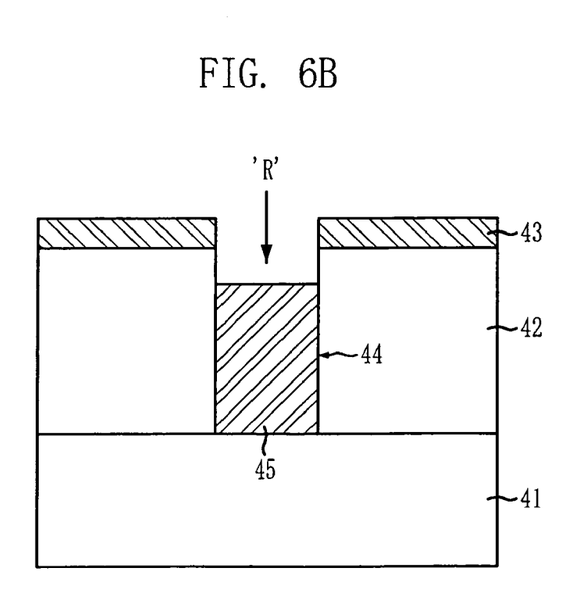

Referring to FIG. 6B, a first plug 45 is filled in a portion of storage node contact hole 44. First plug 45 may include a polysilicon plug. The polysilicon plug may be formed by forming a polysilicon layer and performing an etch-back process. A surface of the polysilicon plug is recessed to obtain a recess profile as denoted with reference denotation 'R.' Thus, first plug 45 fills a portion of storage node contact hole 44, and an upper surface of first plug 45 is not in contact with patterned etch stop layer 43.

Figure 6C:
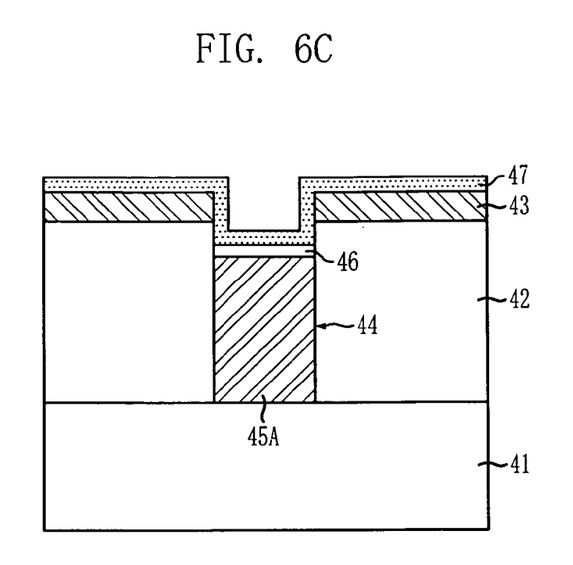

Referring to FIG. 6C, an ohmic contact layer 46 is formed over first plug 45. Ohmic contact layer 46 may include a titanium silicide layer. The titanium silicide layer may be formed by performing a CVD method or an ALD method to form a Ti layer having a thickness of approximately 50 Å or less, performing a RTA process or a furnace thermal treatment process to the Ti Layer, and cleaning non-reacted portions of the Ti layer. For instance, since first plug 45 includes the polysilicon layer, the Ti layer and the polysilicon layer may react to form the titanium silicide layer. The titanium silicide layer provides an ohmic contact and thus reduces resistance of a storage node contact plug. Reference numeral 45A refers to a remaining first plug 45A.

A conductive layer 47 having a desired level of step coverage property is formed on patterned etch stop layer 43, on ohmic contact layer 46, and on sidewalls of the recess profile. For instance, conductive layer 47 may include a TiN layer. Conductive layer 47 may function as a diffusion barrier layer and a storage node contact plug. Conductive layer 47 may be formed using a CVD method or a SFD method to have a thickness ranging from approximately 50 Å to approximately 300 Å.

Figure 6D:
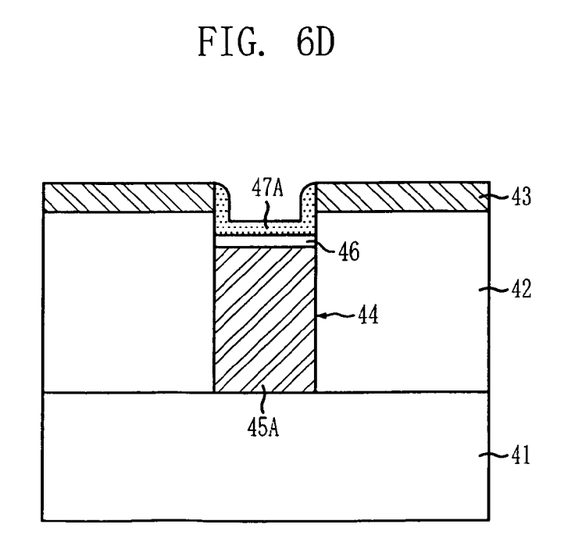

Referring to FIG. 6D, a CMP process or an etch-back process is performed to etch portions of conductive layer 47 in a manner that surfaces of patterned etch stop layer 43 are exposed. Thus, a diffusion barrier layer 47A is formed over the recess profile.

At this time, an etch-back process, such as a plasma etch process, is performed to form diffusion barrier layer 47A at the bottom portion, i.e., above a surface of remaining first plug 45A, and sidewalls of the recess profile. The etch-back process may be performed in a chemical etch rather than in a physical etch. Thus, there is a reduced etching rate at the bottom portion of the recess profile. Accordingly, diffusion barrier layer 47A remains in the bottom portion of recess profile. The etch-back process for forming diffusion barrier layer 47A in the bottom portion and on the sidewalls of the recess profile may use the same method as described previously consistent with the present invention.

Figure 6E:
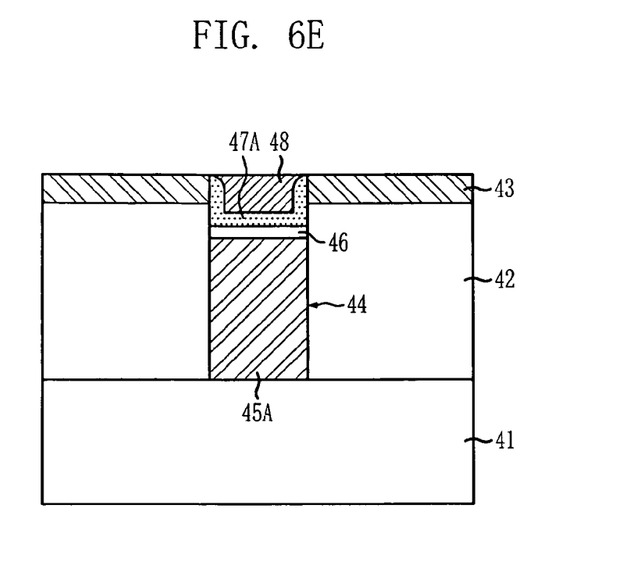

Referring to FIG. 6E, a conductive layer, e.g., a Ru layer, is formed over diffusion barrier layer 47A and filled in the recess profile using a PVD method. A CMP process or an etch-back process may be performed to expose surfaces of patterned etch stop layer 43. Thus, a second plug 48 is formed on diffusion barrier layer 47A and in the recess profile.

At this time, the Ru layer may be formed by the PVD method without using any oxygen gas. Furthermore, the recess profile may be sufficiently filled by the Ru layer using the PVD method, because an aspect ratio of the recess profile is small. Meanwhile, it may be inevitable to use oxygen gas as a reaction gas when a Ru layer is formed using a CVD method or an ALD method. Thus, a material below the Ru layer may be oxidized during the formation of the Ru layer. Accordingly, an adhesion property between a storage node contact plug and a storage node may deteriorate, thereby causing lifting. In certain embodiments, the material below the Ru layer is not oxidized, because the Ru layer for forming second plug 48 is formed using the PVD method without any oxygen gas.

According to the aforementioned process, the storage node contact plug including remaining first plug 45A, diffusion barrier layer 47A, and second plug 48 is formed in contact with a subsequent storage node, wherein diffusion barrier layer 47A is disposed between remaining first plug 45A and second plug 48. Furthermore, ohmic contact layer 46, which provides the ohmic contact, may be formed between remaining first plug 45A and diffusion barrier layer 47A.

In the aforementioned structure of the storage node contact plug, diffusion barrier layer 47A is in contact with patterned etch stop layer 43. However, second plug 48 is not in contact with patterned etch stop layer 43 due to the presence of diffusion barrier layer 47A. A sufficient level of adhesion may be achieved, because the presence of diffusion barrier layer 47A prevents second plug 48 and patterned etch stop layer 43 from contacting each other. Also, oxidation of diffusion barrier layer 47A may not occur during the formation of the Ru layer, because the Ru layer used as second plug 48 is formed by the PVD method without any oxygen gas.

Figure 6F:
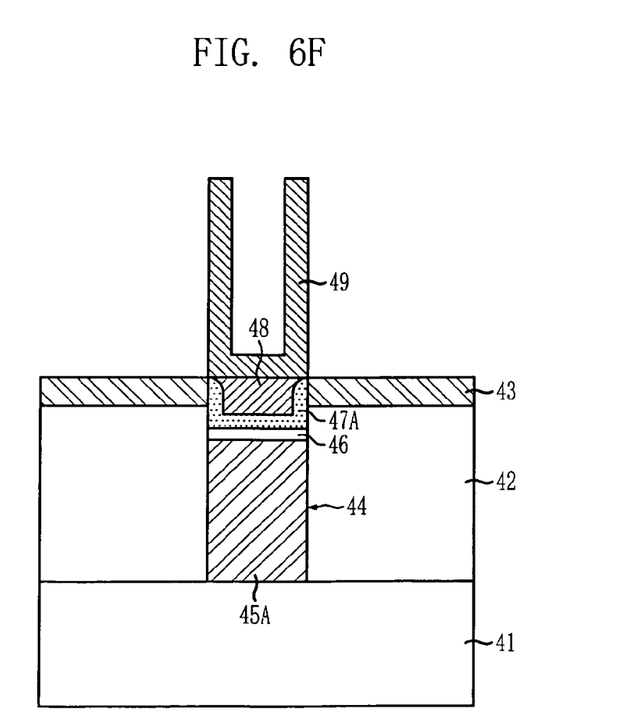

Referring to FIG. 6F, a cylinder type storage node 49 is formed on second plug 48 and contacting second plug 48. Cylinder type storage node 49 may be formed using the method discussed previously. Storage node 49 may include a Ru thin layer or a $RuO_2$ thin layer. A bottom line width of storage node 49 may be substantially equal to or less than the line width of second plug 48.

Further, contact resistance and adhesiveness, which are often impaired when using Ru or $RuO_2$ as a storage node material, are improved. Thus, a sufficient level of structural and electrical properties is maintained, such that capacitors of the semiconductor device become more reliable. Furthermore, the present invention may secure a sufficient level of capacitance demanded in a highly integrated memory device having a design rule of 45 nm or less.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   providing a semiconductor substrate;
   forming an insulation structure over the semiconductor substrate, the insulation structure including a contact hole;
   forming a first plug in a portion of the contact hole;
   forming a diffusion barrier layer in a bottom portion and on sidewalls of a remaining portion of the contact hole;
   forming a second plug over the diffusion barrier layer and filled in the contact hole; and
   forming a storage node over the second plug,
   wherein forming the insulation structure includes:
      forming a first insulation layer over the semiconductor substrate to provide the portion of the contact hole; and
      forming a second insulation layer over the first insulation layer and an etch stop layer over the second insulation layer to provide the remaining portion of the contact hole.

2. The method of claim 1, wherein the etch stop layer comprises a nitride-based layer, and the first and second insulation layers comprise an oxide-based layer.

3. The method of claim 1, wherein the remaining portion of the contact hole has an exposed surface area larger than that of the portion of the contact hole in which the first plug is filled.

4. The method of claim 1, wherein forming a diffusion barrier layer comprises:
   forming a conductive layer over the insulating structure and in the bottom portion and the sidewalls of the remaining portion of the contact hole for use as the diffusion barrier layer; and
   partially removing the conductive layer such that a portion of the conductive layer remains in the bottom portion and the sidewalls of the remaining portion of the contact hole while exposing a surface of the insulation structure.

5. The method of claim 4, wherein the conductive layer is formed to have a thickness ranging from approximately 50 Å to approximately 300 Å using a chemical vapor deposition method or a sequential flow deposition method.

6. The method of claim 4, wherein the conductive layer comprises a titanium nitride layer.

7. The method of claim 1, wherein forming the second plug comprises:
   forming a conductive layer over the insulation structure and the diffusion barrier layer; and
   partially removing the conductive layer to expose a surface of the insulation structure.

8. The method of claim 7, wherein the conductive layer is formed using a physical vapor deposition method.

9. The method of claim 7, wherein the second plug comprises a ruthenium layer.

10. The method of claim 1, wherein the first plug comprises a polysilicon layer, the diffusion barrier layer comprises a titanium nitride layer, and the second plug comprises a ruthenium layer.

11. The method of claim 1, further comprising forming an ohmic contact layer between the first plug and the diffusion barrier layer.

12. The method of claim 11, wherein the ohmic contact layer comprises a titanium silicide layer.

13. The method of claim 1, wherein the storage node comprises a ruthenium layer or a ruthenium oxide layer.

* * * * *